(12) United States Patent
Lee et al.

(10) Patent No.: US 9,190,404 B2
(45) Date of Patent: Nov. 17, 2015

(54) SEMICONDUCTOR DEVICE AND METHOD OF FABRICATING THE SAME

(71) Applicant: Samsung Electronics Co., Ltd., Suwon-si (KR)

(72) Inventors: Hak-Sun Lee, Seoul (KR); Myeongcheol Kim, Suwon-si (KR); Cheol Kim, Hwaseong-si (KR); Sanghyun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 216 days.

(21) Appl. No.: 13/949,289

(22) Filed: Jul. 24, 2013

(65) Prior Publication Data

US 2014/0035048 A1     Feb. 6, 2014

(30) Foreign Application Priority Data

Jul. 31, 2012  (KR) .................. 10-2012-0084075

(51) Int. Cl.
| | |
|---|---|
| *H01L 21/70* | (2006.01) |
| *H01L 27/088* | (2006.01) |
| *H01L 29/78* | (2006.01) |
| *H01L 21/768* | (2006.01) |
| *H01L 27/02* | (2006.01) |
| *H01L 27/11* | (2006.01) |
| *H01L 23/485* | (2006.01) |

(52) U.S. Cl.
CPC ........ *H01L 27/088* (2013.01); *H01L 21/76895* (2013.01); *H01L 23/485* (2013.01); *H01L 27/0207* (2013.01); *H01L 27/1104* (2013.01); *H01L 29/78* (2013.01); *H01L 29/7833* (2013.01); *H01L 2924/0002* (2013.01)

(58) Field of Classification Search
CPC ....... H01L 29/78; H01L 29/41; H01L 29/417; H01L 23/522; H01L 21/768; H01L 21/28; H01L 21/8244; H01L 21/8234; H01L 27/11; H01L 27/088
See application file for complete search history.

(56) References Cited

U.S. PATENT DOCUMENTS

| | | | |
|---|---|---|---|
| 8,114,730 B2 | 2/2012 | Yoo et al. | |
| 2004/0178516 A1* | 9/2004 | Ogata | ........................... 257/903 |
| 2009/0283853 A1 | 11/2009 | Huebinger | |
| 2010/0059810 A1 | 3/2010 | Homma et al. | |
| 2011/0294292 A1* | 12/2011 | Adetutu et al. | ................ 438/675 |
| 2013/0161722 A1* | 6/2013 | Son et al. | ........................ 257/321 |

FOREIGN PATENT DOCUMENTS

| | | |
|---|---|---|
| JP | 2004-228231 | 8/2004 |
| JP | 2010-219289 | 9/2010 |
| JP | 2011-192744 | 9/2011 |
| KR | 1020070094150 A | 9/2007 |

* cited by examiner

*Primary Examiner* — Whitney T Moore
*Assistant Examiner* — Joseph Galvin, III
(74) *Attorney, Agent, or Firm* — Myers Bigel Sibley & Sajovec, P.A.

(57) ABSTRACT

Provided are a semiconductor device and a method of fabricating the same. The device may include a transistor on a substrate comprising a gate insulating pattern, a gate electrode and an impurity region, a shared contact plug electrically connected to the gate electrode and the impurity region, and an etch-stop layer between side surfaces of the gate electrode and the shared contact. The shared contact plug may include a first conductive pattern electrically connected to the first impurity region and a second conductive pattern electrically connected to the gate electrode, and a top surface of the first conductive pattern may be higher than a top surface of the gate electrode.

15 Claims, 16 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0084075, filed on Jul. 31, 2012, in the Korean Intellectual Property Office, the entire contents of which are hereby incorporated by reference.

BACKGROUND

Embodiments of the inventive concept relate to a semiconductor device and a method of fabricating the same. Higher integration of semiconductor devices may be required to satisfy consumer demands for electronic devices. However, owing to increasing technical difficulties in a fabrication process (e.g., a reduced process margin in a lithography process), it is becoming harder to realize highly-integrated semiconductor devices.

SUMMARY

Embodiments of the inventive concept provide a semiconductor device with high integration density.

Other embodiments of the inventive concept provide a method of fabricating the semiconductor device.

According to some embodiments of the inventive concept, a semiconductor device may include a transistor on a substrate including a gate insulating pattern, a gate electrode and impurity regions, a shared contact plug electrically connected to the gate electrode and/or the impurity region, and an etch-stop layer between side surfaces of the gate electrode and the shared contact. The shared contact plug may include a first conductive pattern electrically connected to the first impurity region and a second conductive pattern electrically connected to the gate electrode, and a top surface of the first conductive pattern may be higher than a top surface of the gate electrode.

In some embodiments, the etch-stop layer may include at least one selected from the group consisting of silicon nitride ($Si_xN_y$), silicon carbon nitride ($Si_xC_yN_z$), or silicon oxynitride ($Si_xO_yN_z$).

In some embodiments, the device may further include a spacer on a sidewall of the gate electrode. The spacer may be provided between the gate electrode and the etch-stop layer.

According to some embodiments of the inventive concept, a semiconductor device may include a first transistor on a substrate including a first gate insulating pattern, a first gate electrode and first impurity regions, a second transistor on the substrate including a second gate insulating pattern, a second gate electrode and second impurity regions, a first contact plug electrically connecting the first gate electrode to one of the first impurity regions, a second contact plug electrically connected to one of the second impurity regions, and an etch-stop layer between side surfaces of the first gate electrode and the first contact plug and between side surfaces of the second gate electrode and the second contact plug. The second contact plug may include a first conductive pattern, whose top surface is higher than a top surface of the second gate electrode, and a second conductive pattern provided on the first conductive pattern.

In some embodiments, the first contact plug may include a third conductive pattern electrically connected to the first impurity region, and a fourth conductive pattern electrically connected to the first gate electrode. The third conductive pattern has a top surface that may be higher than that of the first gate electrode.

According to some embodiments of the inventive concept, a method of fabricating a semiconductor device may include forming a first transistor and a second transistor on a substrate, the first transistor including a first gate insulating pattern, a first gate electrode and first impurity regions, and the second transistor including a second gate insulating pattern, a second gate electrode and second impurity regions, conformally forming an etch-stop layer on the first and second transistors, forming a first conductive pattern electrically connected to one of the first impurity regions and a second conductive pattern electrically connected to one of the second impurity regions, forming a third conductive pattern electrically connected to the first conductive pattern and the first gate electrode, and forming a fourth conductive pattern electrically connected to the second conductive pattern. The second conductive pattern may be formed to have a top surface that may be higher than that of the second gate electrode.

In some embodiments, the forming of the first and second conductive patterns may include forming a first insulating layer on the etch-stop layer to fill a space between the first and second transistors, etching the first insulating layer to form a first contact hole exposing the first impurity region and a second contact hole exposing the second impurity region, and forming the first and second conductive patterns to fill the first and second contact holes, respectively.

In some embodiments, the method may further include conformally forming a barrier layer on the insulating layer, in which the first and second contact holes may be formed.

In some embodiments, the forming of the third conductive pattern may include forming a second insulating layer having a first opening on the first insulating layer, the first opening being formed to expose a portion of the first insulating layer located on the first gate electrode and at least a portion of the first conductive pattern, forming a mask pattern covering a portion of the opening and exposing a portion of the first insulating layer facing the first gate electrode, etching the first insulating layer with the mask pattern as an etch mask to form a second opening exposing at least partially a top surface of the gate electrode, and forming the third conductive pattern to fill the first and second openings.

In some embodiments, the method may further include conformally forming a barrier layer on the first and second insulating layers provided with the first and second openings.

In some embodiments, the forming of the fourth conductive pattern may include forming a second insulating layer on the first insulating layer to have an opening exposing at least a portion of the second conductive pattern, and forming the fourth conductive pattern to fill the opening.

In some embodiments, the method may further include conformally forming a barrier layer on the second insulating layer with the opening.

BRIEF DESCRIPTION OF THE DRAWINGS

Embodiments will be more clearly understood from the following brief description taken in conjunction with the accompanying drawings. The accompanying drawings represent non-limiting embodiments as described herein.

FIGS. 1A through 1J are sectional views illustrating a method of fabricating a semiconductor device, according to various embodiments of the inventive concept.

Figure 1A:
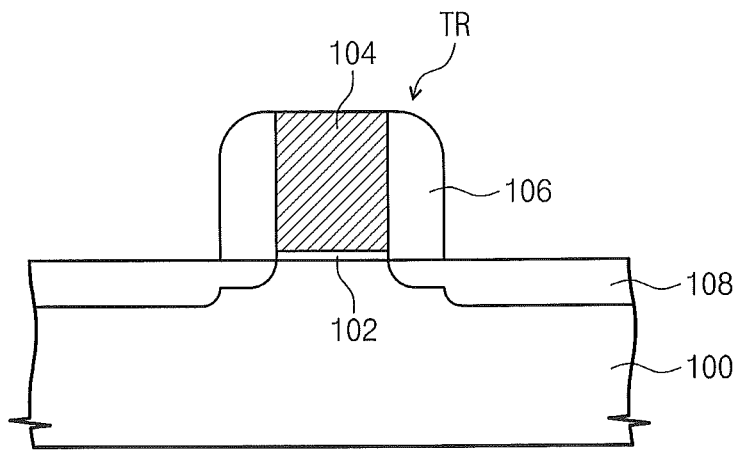

It should be noted that these figures are intended to illustrate the general characteristics of methods, structure and/or materials utilized in embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventive concept will now be described more fully with reference to the accompanying drawings, in which some embodiments are shown. Embodiments of the inventive concept may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments of the inventive concept are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of embodiments.

Unless otherwise defined, all terms (including technical and scientific terms) used herein have the same meaning as commonly understood by one of ordinary skill in the art to which embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1J are sectional views illustrating a method of fabricating a semiconductor device, according to various embodiments of the inventive concept.

Referring to FIG. 1A, a transistor TR may be formed on a substrate 100.

The transistor TR may include a gate insulating pattern 102, a gate electrode 104, a spacer 106, and impurity regions 108. Embodiments of the inventive concept will not be limited to the planar type transistor, in which the gate insulating pattern 102 and the gate electrode 104 are sequentially stacked on the substrate 100.

According to some embodiments of the inventive concept, although not shown in detail, the transistor TR may further include a mask pattern provided on the gate electrode 104.

Figure 1B:
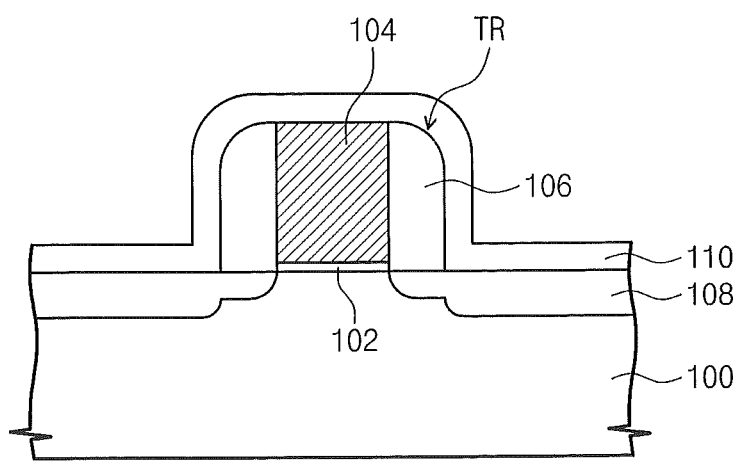

Referring to FIG. 1B, a first etch-stop layer 110 may be conformally formed on the substrate 100 provided with the transistor TR. The first etch-stop layer 110 may include nitride, carbon nitride, or oxynitride. For example, the first etch-stop layer 110 may include silicon nitride ($Si_xN_y$), silicon carbon nitride ($Si_xC_yN_z$), or silicon oxynitride ($Si_xO_yN_z$).

Figure 1C:
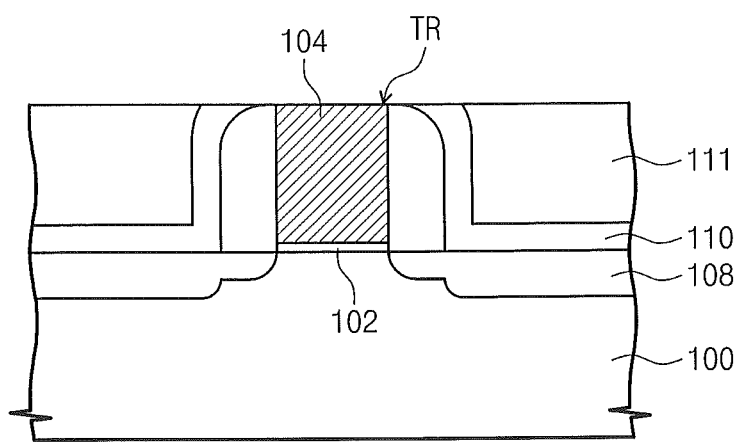

Referring to FIG. 1C, a first insulating layer 111 may be formed on the first etch-stop layer 110. Thereafter, the etch-stop layer and first insulating layer may be polished to expose a top surface of the gate electrode 104. Referring to FIG. 1D, the second insulating layer 112 may be formed on the first insulating layer. The second insulating layer 112 may be formed to cover the exposed gate electrode 104. According to some embodiments of the inventive concept, the second insulating layer 112 may be formed to have a top surface that is higher than that of the gate electrode 104.

Figure 1E:
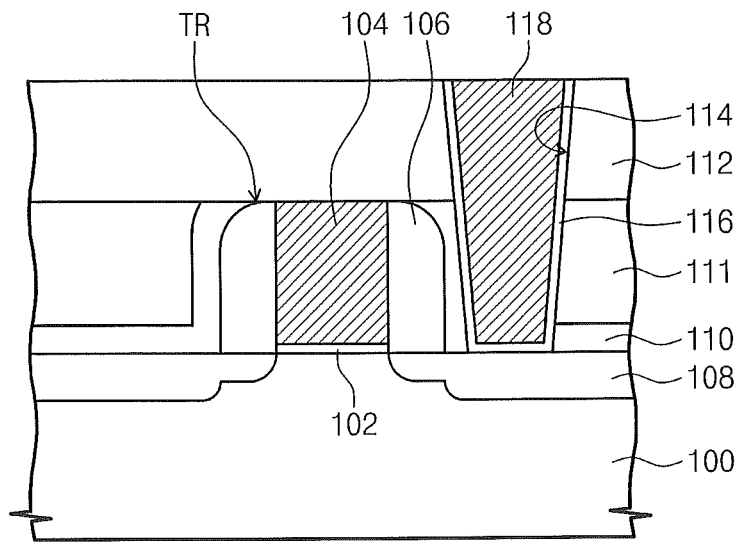

Referring to FIG. 1E, a first conductive pattern 118 may be formed through the first and second insulating layers 111 and 112 to be electrically connected to the impurity region 108.

According to some embodiments of the inventive concept, a first barrier pattern 116 may be formed between the first conductive pattern 118 and the first and second insulating layers 111 and 112. The first barrier pattern 116 may be formed to cover bottom and side surfaces of the first conductive pattern 118. The first barrier pattern 116 may include a metal nitride layer (e.g., of titanium nitride).

The formation of the first conductive pattern 118 and the first barrier pattern 116 will be described in more detail. First, the first and second insulating layer 111 and 112 and the first etch-stop layer 110 may be etched to form a first contact hole 114 exposing the impurity region 108. For example, the etching process may be performed to etch the first etch-stop layer 110 provided on the impurity region 108. In addition, the first etch-stop layer 110 provided on a side surface of the spacer 106 may be partially etched during the etching process. In some embodiments, the first contact hole 114 may be formed not to expose the side surface of the spacer 106.

A first barrier layer (not shown) may be formed on the first and second insulating layers 111 and 112 with the first contact hole. The first barrier layer may be formed not to fill completely an inner space of the first contact hole 114. Thereafter, a first conductive layer (not shown) may be formed on the first and second insulating layer 111 and 112 to fill the first contact hole 114 provided with the first barrier layer. The conductive layer may include a metal layer (e.g., of tungsten). The first conductive layer and first barrier layer may be polished to expose a top surface of the second insulating layer 112, thereby forming the first barrier pattern 116 and the first conductive pattern 118 in the first contact hole 114.

In some embodiments, the first conductive pattern 118 may be formed to have a top surface that is higher than that of the gate electrode 104. For example, a total height of the first conductive pattern 118 may be about 1.3 times that of the gate electrode 104. In other embodiments, the first conductive pattern 118 may be formed in such a way that the total height thereof is about 1.3 times to about 2.0 times of that of the gate electrode 104.

Figure 1F:
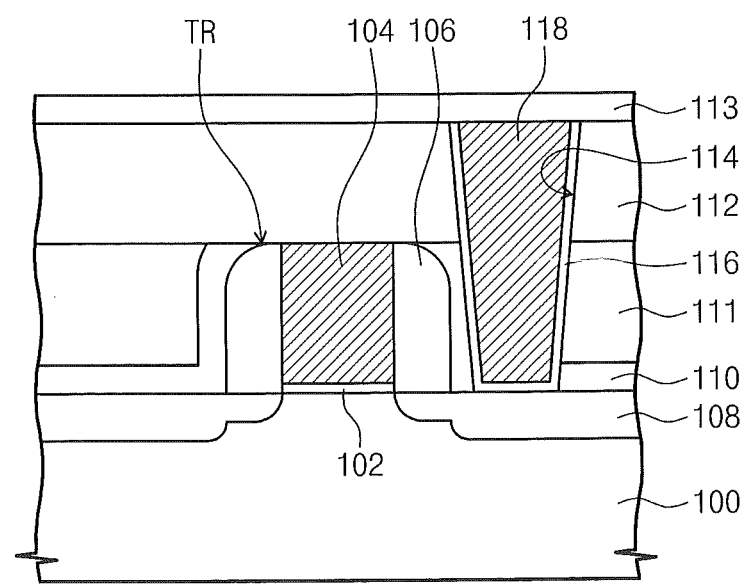

Referring to FIG. 1F, a second etch-stop layer 113 may be formed on the second insulating layer 112 and the first conductive pattern 118. The second etch-stop layer 113 may include nitride, carbon nitride, or oxynitride. For example, the second etch-stop layer 113 may include at least one selected from the group consisting of silicon nitride ($Si_xN_y$), silicon carbon nitride ($Si_xC_yN_z$), and silicon oxynitride ($Si_xO_yN_z$).

Figure 1G:
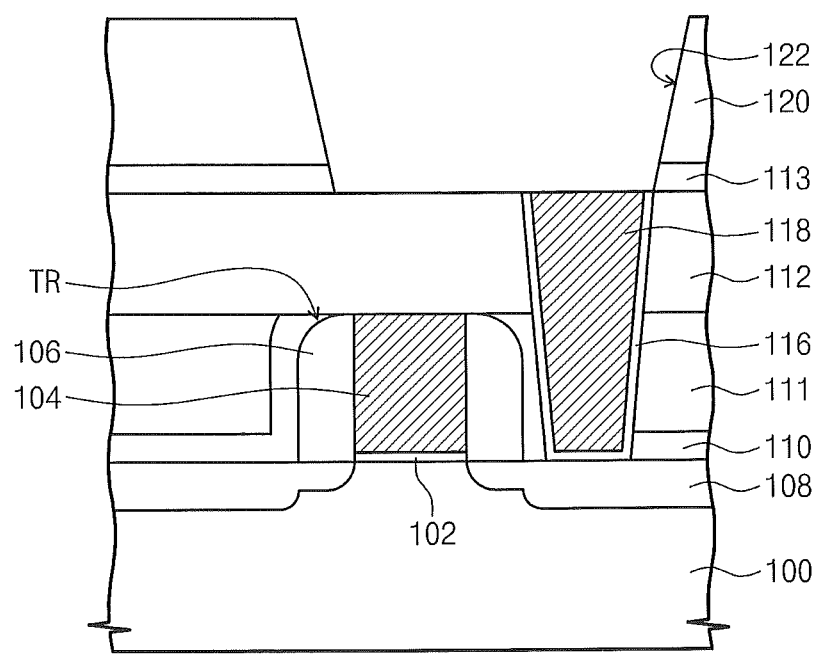

Referring to FIG. 1G, a third insulating layer 120 may be formed on the second insulating layer 112 to have a first opening 122. The first opening 122 may be formed to expose the top surface of the first conductive pattern 118 and a portion of the top surface of the second insulating layer 112 that faces a top surface of the gate electrode 104. During the formation of the first opening 122, the second etch-stop layer 113 may be partially etched.

In some embodiments, the first opening 122 may be formed to have a first width. Hereinafter, the width of the opening refers to an average of lateral width measured along the direction crossing the gate electrode 104.

Figure 1H:
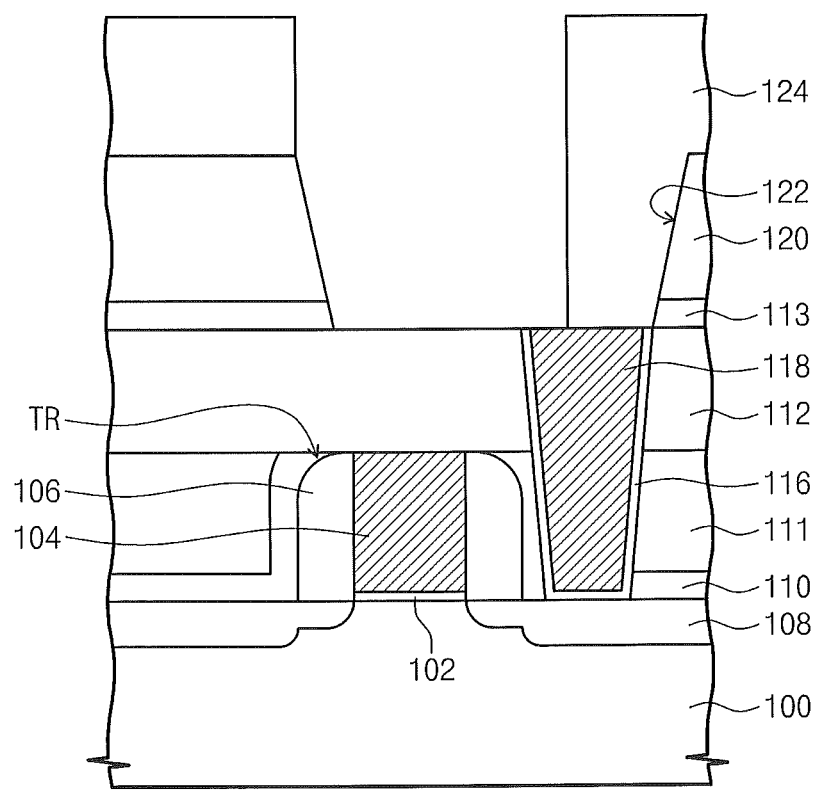

Referring to FIG. 1H, a mask pattern 124 may be formed on the third insulating layer 120 to expose a portion of the first opening 122. The mask pattern 124 may be formed to expose at least the portion of the top surface of the second insulating layer 112 that faces a top surface of the gate electrode 104.

Figure 1I:
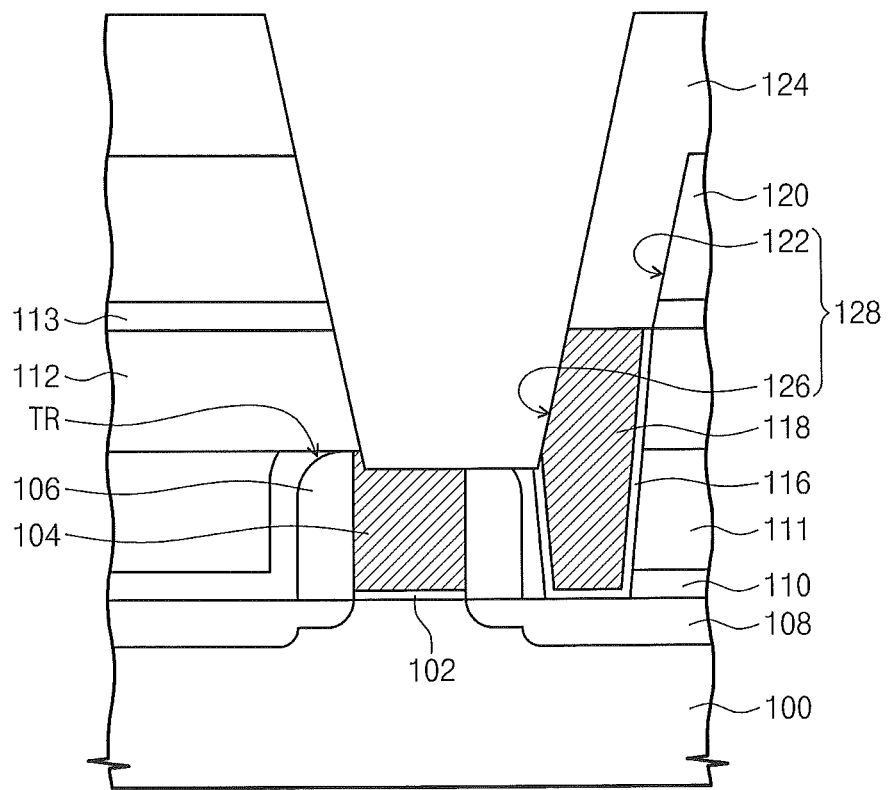

Referring to FIG. 1I, using the mask pattern 124 and the third insulating layer 120 as an etch mask, the second insulating layer 112 may be etched to form a second opening 126 exposing the top surface of the gate electrode 104. A width of the second opening 126 may be smaller than the first width.

According to some embodiments of the inventive concept, a side surface of the first conductive pattern 118 may be partially etched during the etching process.

According to other embodiments of the inventive concept, a top surface of the gate electrode 104 may be recessed by the etching process.

The first and second openings 122 and 126 may be connected to each other, thereby forming a second contact hole 128.

Figure 1J:
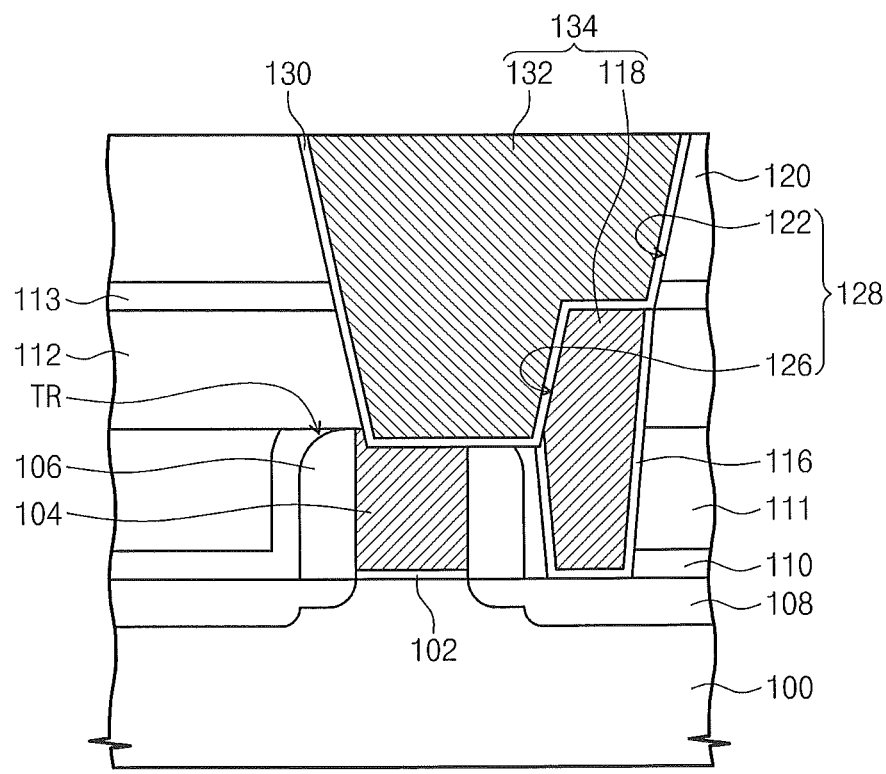

Referring to FIG. 1J, the mask pattern 124 may be removed, and then, a second conductive pattern 132 may be formed to fill the second contact hole 128. The second conductive pattern 132 and the first conductive pattern 118 may be electrically connected to each other to constitute a contact plug 134.

According to some embodiments of the inventive concept, a second barrier pattern 130 may be further formed between the second conductive pattern 132 and the first and second insulating layers 112 and 120. The second barrier pattern 130 may be formed to cover or surround bottom and side surfaces of the second conductive pattern 132.

As described above, the contact plug 134 may be a shared contact plug consisting of the first and second conductive patterns 118 and 132 that are electrically connected to the impurity region 108 and the gate electrode 104, respectively and are electrically connected to each other. Not only the spacer 106 but also the first etch-stop layer 110 may be interposed between the side surfaces of the first conductive pattern 118 and the gate electrode 104, and thus, it is possible to suppress a current leakage therebetween from occurring.

Figure 2:
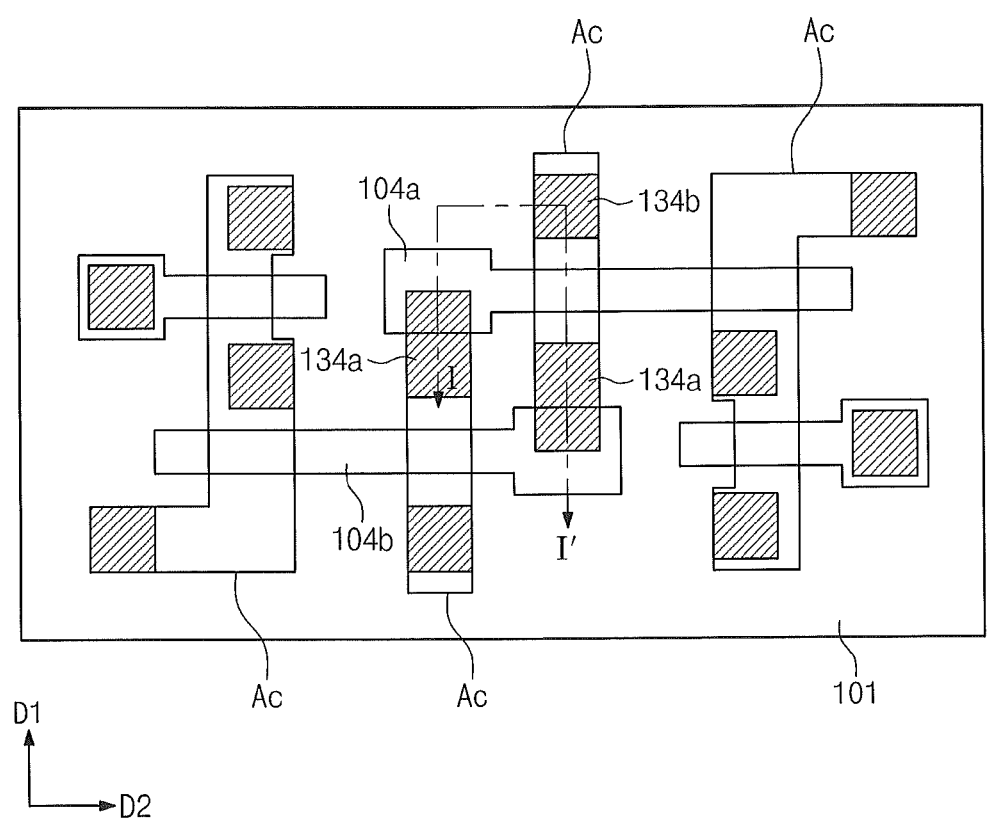
FIG. 2 is a plan view of a semiconductor device according to other embodiments of the inventive concept.

FIG. 2 is a plan view of a semiconductor device according to other embodiments of the inventive concept, and FIGS. 3A through 3F are sectional views illustrating a method of fabricating a semiconductor device, according to other embodiments of the inventive concept. For example, FIGS. 3A through 3F are sectional views taken along a line I-I' of FIG. 2.

Referring to FIG. 2, a static random access memory (SRAM) may be realized using the fabricating process described with reference to FIGS. 1A through 1J. The SRAM may include a memory cell, in which pull-up transistors, pull-down transistors and driving transistors are provided. Embodiments of the inventive concept will not be limited to the SRAM to be described below.

Figure 3A:
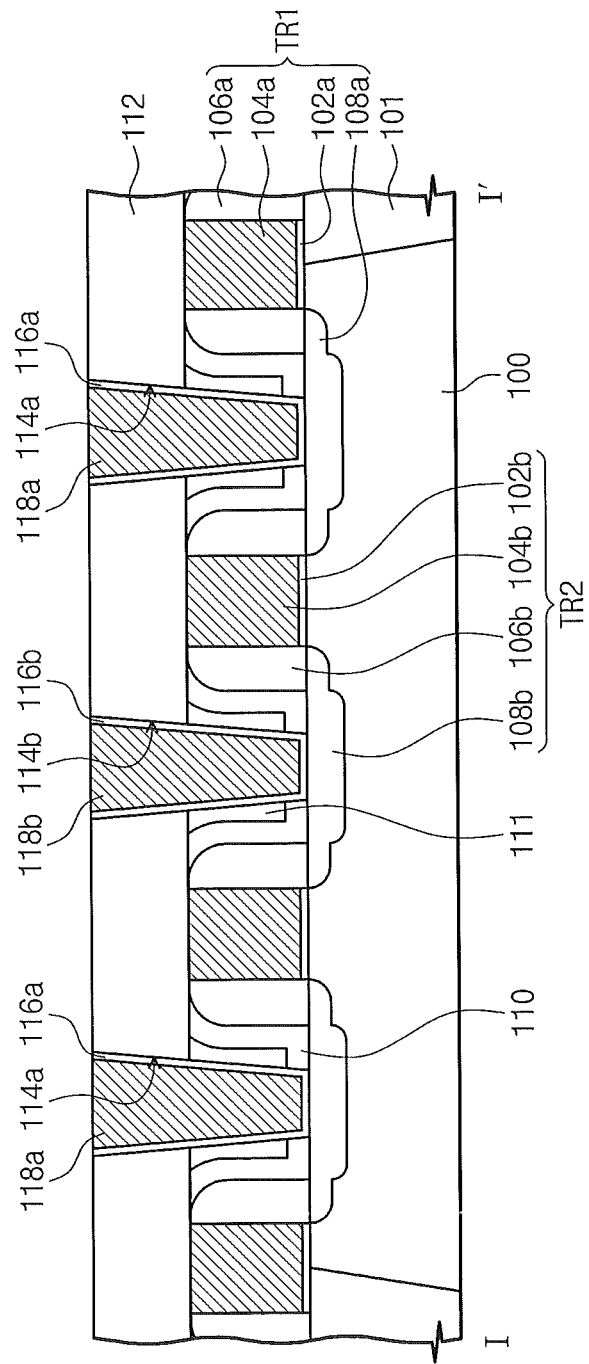
FIGS. 3A through 3F are sectional views illustrating a method of fabricating a semiconductor device, according to other embodiments of the inventive concept.

Referring to FIGS. 2 and 3A, a first transistor TR1, a second transistor TR2, the first etch-stop layer 110, the first insulating layer 111, the second insulating layer 112, a first conductive pattern 118a, and a second conductive pattern 118b may be formed on the substrate 100.

A device isolation pattern 101 may be formed on the substrate to define an active region Ac. For example, as shown in FIG. 2, the active region Ac may be shaped like a bar extending along a first direction D1.

The first transistor TR1 may include a first gate insulating pattern 102a, a first gate electrode 104a, a first spacer 106a, and first impurity regions 108a, and the second transistor TR2 may include a second gate insulating pattern 102b, a second gate electrode 104b, a second spacer 106b, and second impurity regions 108b.

The first and second gate electrodes 104a and 104b may be formed to extend along a second direction D2 crossing the first direction D1. In some embodiments, the second direction D2 may be orthogonal to the first direction D1.

The first etch-stop layer 110 may be removed from top surfaces of the first and second gate electrodes 104a and 104b to remain on sidewalls of the first and second spacers 106a and 106b. As shown, the first etch-stop layer 110 may be formed to be interposed between the first and second gate electrodes 104a and 104b and the first and second conductive patterns 118a and 118b.

The first and second insulating layers 111 and 112 may include a first contact hole 114a exposing a top surface of the first impurity region 108a and a second contact hole 114b exposing a top surface of the second impurity region 108b. The first conductive pattern 118a may be formed to fill the first contact hole 114a, while the second conductive pattern 118b may be formed to fill the second contact hole 114b. In some embodiments, the first and second conductive patterns 118a and 118b may be formed to have the substantially same structure and shape as each other.

According to some embodiments of the inventive concept, a first barrier pattern 116a may be further formed between the first conductive pattern 118a and first and second insulating layers 111 and 112, and a second barrier pattern 116b may be further formed between the second conductive pattern 118b and first and second insulating layers 111 and 112.

The first and second transistors TR1 and TR2, the first and second insulating layers 111 and 112, and the first and second conductive patterns 118a and 118b may be formed using the same process as that for the transistor TR, the first and second insulating layers 111 and 112, and the conductive pattern 118 described with reference to FIGS. 1A through 1E, and thus, for the sake of brevity, a detailed description thereof will be omitted.

Figure 3B:
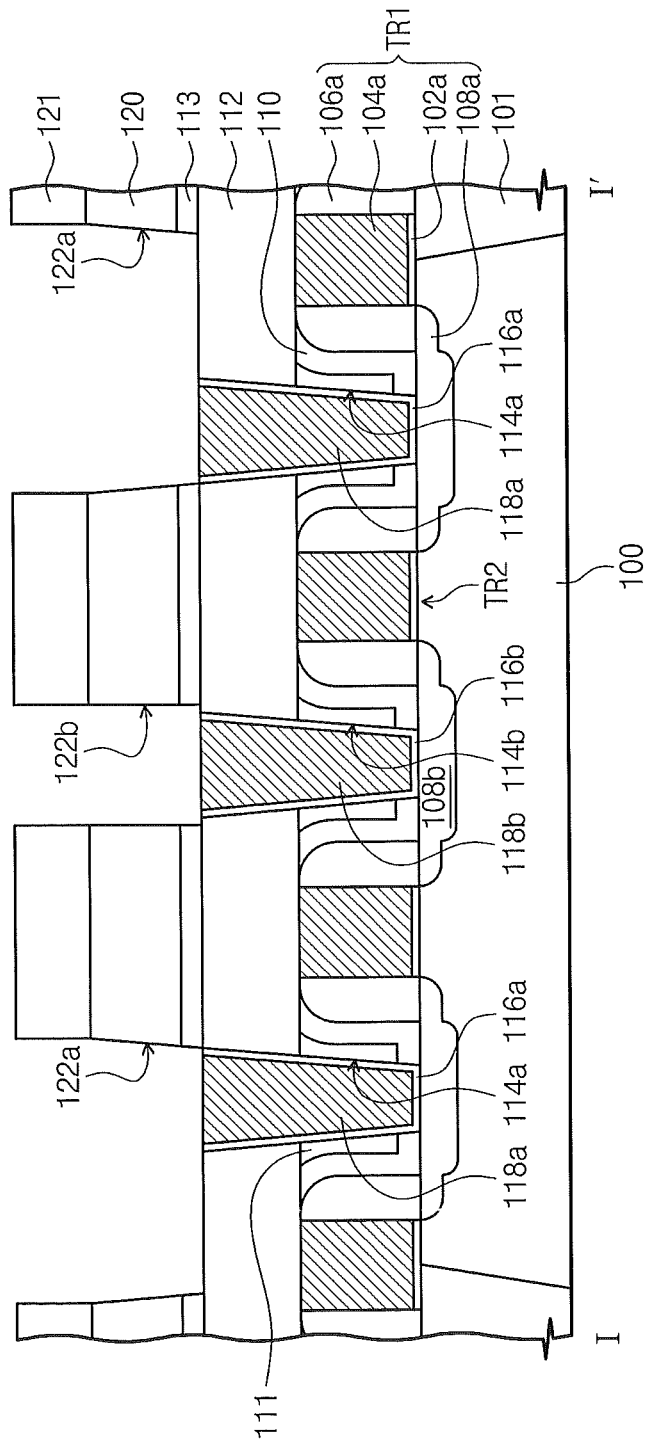

Referring to FIG. 3B, the second etch-stop layer 113, the third insulating layer 120 and a first mask pattern 121 may be sequentially formed on the second insulating layer 112, and then, the second etch-stop layer 113 and the third insulating layer 120 may be etched using the first mask pattern 121 as an etch mask to form the third insulating layer 120 with a first opening 122a and a second opening 122b.

In some embodiments, the first opening 122a may be formed to expose the first conductive pattern 118a and a portion of the second insulating layer 112 facing (or placed directly on) the first gate electrode 104a. The second opening 122b may be formed to expose the second conductive pattern 118b. The first opening 122a may be formed to have a width greater than that of the second opening 122b.

Figure 3C:
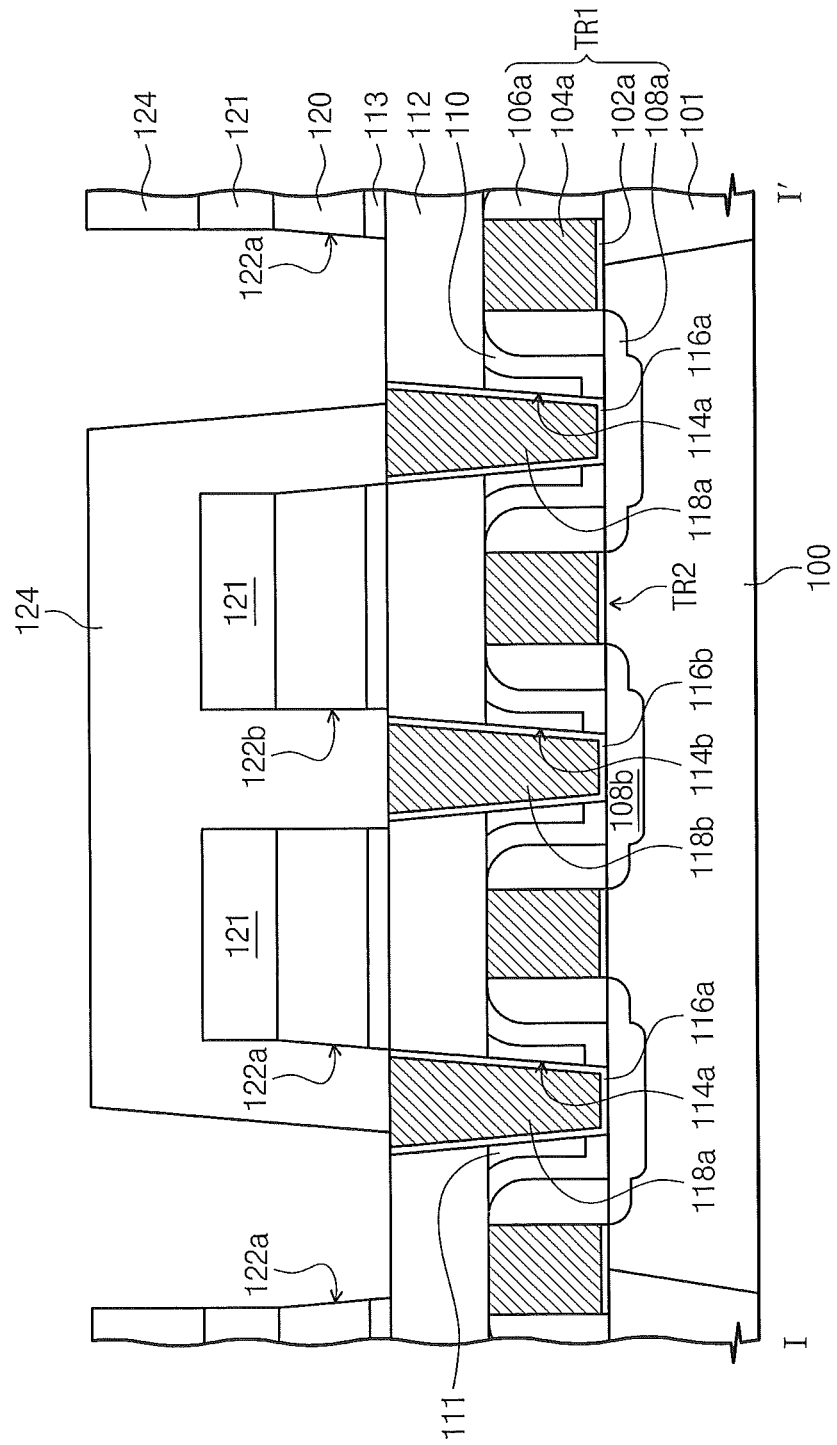

Referring to FIG. 3C, the second mask pattern 124 may be formed on the first mask pattern 121. The second mask pattern 124 may be formed to cover completely the second opening 122b and expose selectively the portion of the second insulating layer 112 facing the first gate electrode 104a.

Figure 3D:
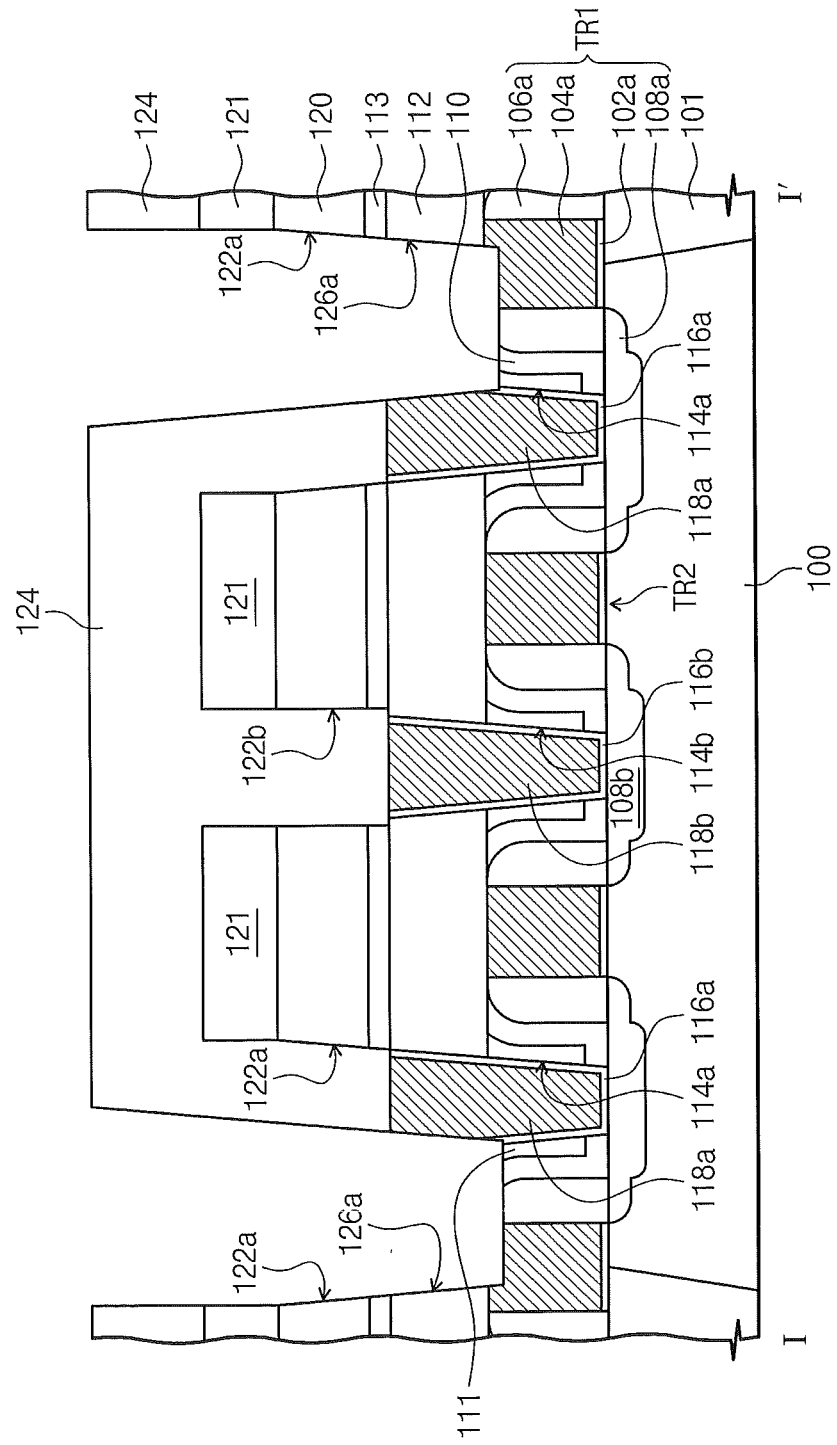

Referring to FIG. 3D, using the second mask pattern 124 as an etch mask, the second insulating layer 112 may be etched to form a third opening 126a exposing the top surface of the first gate electrode 104a.

According to some embodiments of the inventive concept, the etching process may be performed to etch a portion of the side surface of the first conductive pattern 118a. In addition, the etching process may be performed to recess the top surface of the first gate electrode 104a.

Figure 3E:
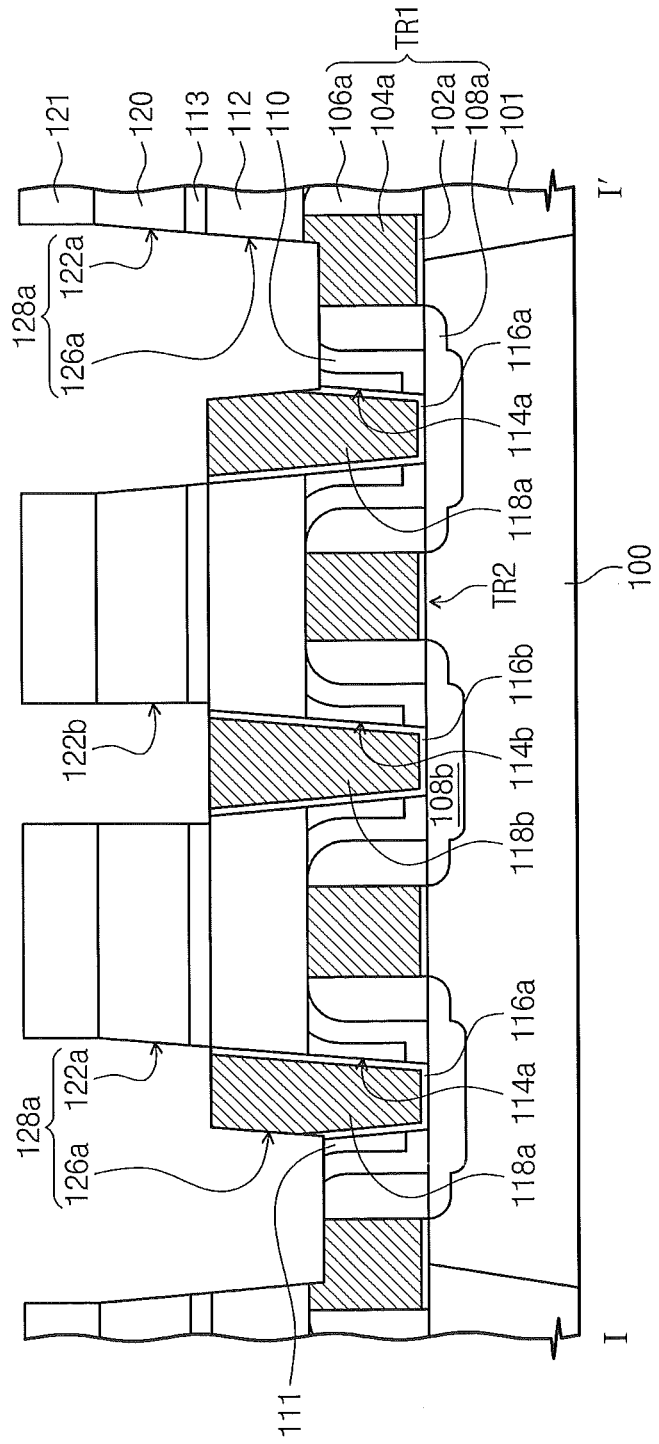

Referring to FIG. 3E, the second mask pattern 124 may be removed to expose the first and third openings 122a and 126a. The first opening 122a and the third opening 126a may be connected to each other, thereby constituting a third contact hole 128a.

Figure 3F:
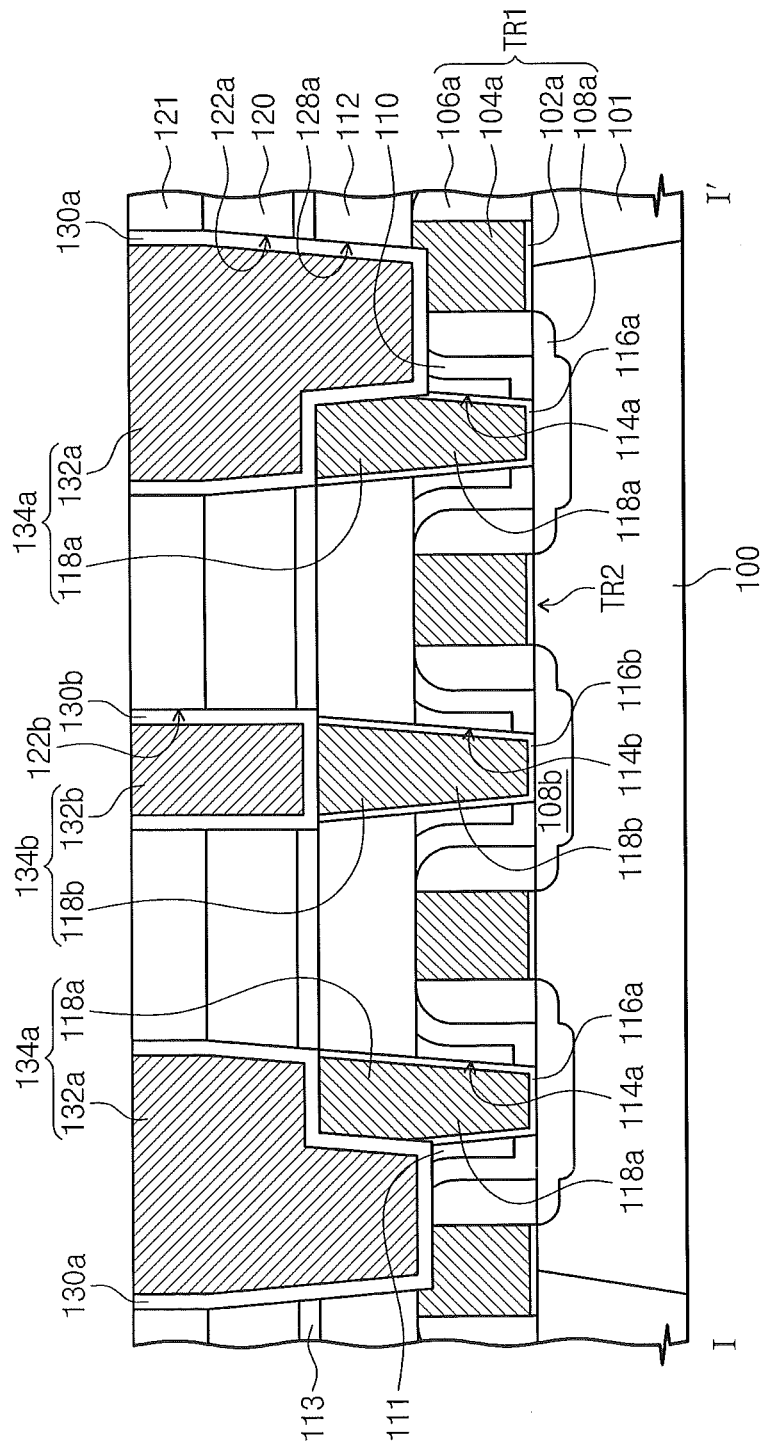

Referring to FIG. 3F, the third contact hole 128a and the second opening 122b may be filled with a third conductive pattern 132a and a fourth conductive pattern 132b, respectively.

According to some embodiments of the inventive concept, a third barrier pattern 130a may be further formed to cover or surround bottom and side surfaces of the third conductive pattern 132a, and a fourth barrier pattern 130b may be further formed to cover or surround bottom and side surfaces of the fourth conductive pattern 132b.

In some embodiments, the first conductive pattern 118a and the third conductive pattern 132a may be electrically connected to each other. The first conductive pattern 118a may be electrically connected to the first impurity region 108a, and the third conductive pattern 132a may be electrically connected to the first gate electrode 104a. Accordingly, the first and third conductive patterns 118a and 132a may serve as a shared first contact plug 134a connecting the first gate electrode 104a to the first impurity region 108a. The second conductive pattern 118b and fourth conductive pattern 132b may serve as a second contact plug 134b connected to the second impurity region 108b.

In some embodiments, not only the first spacer 106a but also the first etch-stop layer 110 may be interposed between the side surfaces of the first conductive pattern 118a of the first contact plug 134a and the first gate electrode 104a, thereby improving electric reliability or leakage current characteristics therebetween. Similarly, not only the second spacer 106b but also the first etch-stop layer 110 may be interposed between the side surfaces of the third conductive pattern 118b of the second contact plug 134b and the second gate electrode 104b, thereby improving electric reliability or leakage current characteristics therebetween.

In addition, in the second contact plug 134b, the second conductive pattern 118b may be formed to have a top surface higher than that of the second gate electrode 104b. Accordingly, the top surface of the second gate electrode 104b may be electrically separate from the sidewall of the second conductive pattern 118b by the second spacer 106b, the first etch-stop layer 110, and the first insulating layer 111 interposed therebetween. This enables to suppress an electric failure (e.g., short or leakage) from occurring between the second contact plug 134b and the second gate electrode 104b.

Figure 4:
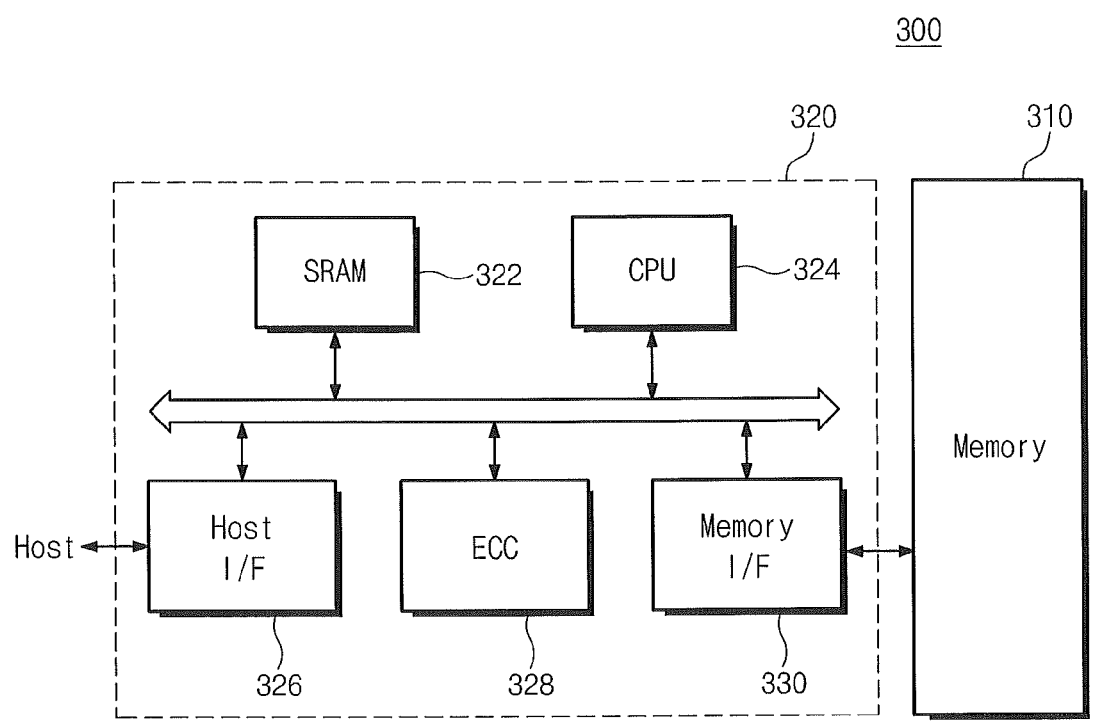
FIG. 4 is a block diagram illustrating a memory card including a semiconductor device according to various embodiments of the inventive concept.

FIG. 4 is a block diagram illustrating a memory card including a semiconductor device according to some embodiments of the inventive concept.

Referring to FIG. 4, a semiconductor device according to some embodiments of the inventive concept may be applied to form a memory card 300. The memory card 300 may include a memory controller 320 to control a data exchange between a host and a memory device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

The memory device 310 in the memory card 300 may be the semiconductor device according to the exemplary embodiments of the inventive concept. In this case, it is possible to improve an electric isolation between a transistor and a contact plug. Accordingly, the semiconductor device can have an increased reliability.

Figure 5:
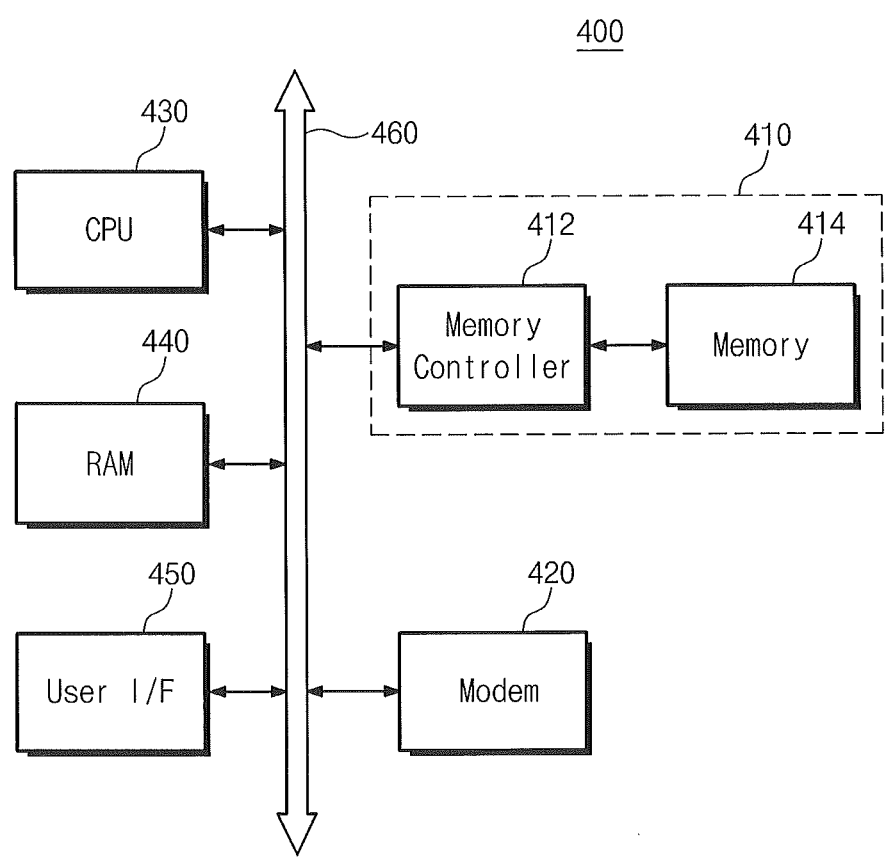
FIG. 5 is a block diagram illustrating an information processing system including a semiconductor device according to various embodiments of the inventive concept.

FIG. 5 is a block diagram illustrating an information processing system including a semiconductor device according to some embodiments of the inventive concept.

Referring to FIG. 5, an information processing system 400 may include a semiconductor device according to some embodiments of the inventive concept. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 4. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to some embodiments of the inventive concept, an etch-stop layer may remain between side surfaces of a gate electrode and a shared contact plug. Due to the presence of the etch-stop layer, it is possible to improve electrical reliability between the gate electrode and the shared contact plug.

While various embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a transistor on a substrate comprising a gate insulating pattern, a gate electrode and an impurity region;
a shared contact plug electrically connected to the gate electrode and the impurity region; and
an etch-stop layer between side surfaces of the gate electrode and the shared contact plug,
wherein the shared contact plug comprises a first conductive pattern electrically connected to the impurity region and a second conductive pattern electrically connected to the gate electrode, and wherein a top surface of the first conductive pattern is higher than a top surface of the gate electrode,
wherein the second conductive pattern is on a portion of a sidewall of the first conductive pattern and on the top surface of the first conductive pattern,
wherein the top surface of the first conductive pattern is parallel to and remote from a surface of the substrate.

2. The device of claim 1, wherein the etch-stop layer comprises at least one selected from the group consisting of silicon nitride ($Si_xN_y$), silicon carbon nitride ($Si_xC_yN_z$) or silicon oxynitride ($Si_xO_yN_z$).

3. The device of claim 1, further comprising a spacer provided on a sidewall of the gate electrode, wherein the spacer is provided between the gate electrode and the etch-stop layer.

4. A semiconductor device, comprising:
a first transistor on a substrate comprising a first gate insulating pattern, a first gate electrode and first impurity regions;
a second transistor on the substrate comprising a second gate insulating pattern, a second gate electrode and second impurity regions;
a first contact plug electrically connecting the first gate electrode to one of the first impurity regions;
a second contact plug electrically connected to one of the second impurity regions; and
an etch-stop layer between side surfaces of the first gate electrode and the first contact plug and between side surfaces of the second gate electrode and the second contact plug,
wherein the second contact plug comprises a first conductive pattern, whose top surface is higher than that of the second gate electrode, and a second conductive pattern provided on a portion of a sidewall of the first conductive pattern and the top surface of the first conductive pattern,
wherein the first contact plug comprises a third conductive pattern electrically connected to the first impurity region and a fourth conductive pattern electrically connected to the first gate electrode,
wherein the third conductive pattern has a top surface that is higher than a top surface of the first gate electrode, and
wherein the fourth conductive pattern is on a portion of a sidewall of the third conductive pattern and on the top surface of the third conductive pattern.

5. A semiconductor device, comprising:
a transistor on a substrate comprising a gate insulating pattern, a gate electrode and an impurity region;
a contact plug comprising first conductive pattern electrically connected to the impurity region and a second conductive pattern electrically connected to the gate electrode, wherein the second conductive pattern is electrically connected to the first conductive pattern through a first barrier pattern, and wherein a top surface of the first conductive pattern is higher than a top surface of the gate electrode: and
an insulating between side surfaces of the gate electrode and the first conductive pattern,
wherein the second conductive pattern comprises a first portion contacting the top surface of the gate electrode, a second portion adjacent to the first portion and contacting the side surface of the first conductive pattern at a level higher than the top surface of the gate electrode, and a third portion adjacent the second portion and contacting the top surface of the first conductive pattern.

6. The device of claim 5, wherein the first conductive pattern comprises a second barrier pattern between the first conductive pattern and the impurity region and along sidewalls of the first conductive pattern.

7. The device of claim 5, wherein the first barrier pattern extends along the first, second and third portions of the second conductive pattern and along sidewalls of the second conductive pattern.

8. The device of claim 5, further comprising:
a second transistor on the substrate comprising a second gate insulating pattern, a second gate electrode and a second impurity region;
a second contact plug comprising a third conductive pattern electrically connected to the second impurity region, wherein a top surface of the third conductive pattern is higher than a top surface of the second gate electrode; and
a second insulating layer between side surfaces of the second gate electrode and the third conductive pattern.

9. The device of claim 8, wherein the second contact plug further comprises a fourth conductive pattern electrically connected to the top surface of the third conductive pattern.

10. The device of claim 5, further comprising a spacer provided on a sidewall of the gate electrode, wherein the spacer is provided between the gate electrode and the insulating layer.

11. The device of claim 10, wherein the insulating layer comprises an etch-stop layer that fills a gap between a sidewall of the spacer and a sidewall of the first conductive pattern.

12. The device of claim 11, wherein the etch-stop layer comprises at least one of silicon nitride ($Si_xN_y$), silicon carbon nitride ($Si_xC_yN_z$), and silicon oxynitride ($Si_xO_yN_z$).

13. The device of claim 1, wherein the etch-stop layer is a first etch-stop layer, the device further comprising:
a second etch-stop layer,
wherein the top surface of the first conductive pattern is coplanar with a bottom surface of the second etch-stop layer.

14. The device of claim 4, wherein the etch-stop layer is a first etch-stop layer, the device further comprising:
a second etch-stop layer,
wherein the top surface of the first conductive pattern and the top surface of the third conductive pattern are coplanar with a bottom surface of the second etch-stop layer.

15. The device of claim 5, wherein the etch-stop layer is a first etch-stop layer, the device further comprising:
a second etch-stop layer,
wherein the top surface of the first conductive pattern is coplanar with a bottom surface of the second etch-stop layer.

* * * * *